United States Patent [19]

Fujita et al.

[11] Patent Number: 4,910,738
[45] Date of Patent: Mar. 20, 1990

[54] SHORT OPTICAL PULSE GENERATORS USING MODE-LOCKED SEMICONDUCTOR LASERS OSCILLATING IN TRANSVERSE MAGNETIC MODES

[75] Inventors: Toshihiro Fujita, Toyonaka; Jun Ohya, Osaka, both of Japan

[73] Assignee: Matsushita Electric Industrial Co., Ltd., Osaka, Japan

[21] Appl. No.: 276,858

[22] Filed: Nov. 28, 1988

[30] Foreign Application Priority Data

Nov. 27, 1987 [JP] Japan .................................. 62-300706

[51] Int. Cl.$^4$ ............................................ H01S 3/098
[52] U.S. Cl. ........................................ 372/18; 372/97; 372/49; 372/27; 372/19
[58] Field of Search ................... 372/18, 25, 92, 97, 372/49, 27, 22, 96, 19

[56] References Cited

U.S. PATENT DOCUMENTS

| | | | |
|---|---|---|---|
| 4,328,468 | 5/1982 | Krawczak et al. | 372/97 |
| 4,504,950 | 3/1985 | Auteung | 372/97 |
| 4,748,632 | 5/1988 | Preston | 372/97 |

OTHER PUBLICATIONS

Polarization Switching in a Single-Frequency External-Cavity Semiconductor Laser, T. Fujita, A. Schremer, C. L. Tang, 6/16/87.
Miniaturized Light Source of Coherent Blue Radiation by: t. Taniuchi, K. Yamamoto, (1986).
Intensity Fluctuation in Semiconductor Lasers Coupled to External Cavity, by: Hisanao Sato, Toshihiro Fujita, & Katsuyuki Fujito, 5/24/84.
Polarization Bistability in External Cavity Semincondutor Lasers, by: T. Fujita, A. Schremer, and C. L. Tang, 8/10/87.

*Primary Examiner*—Léon Scott, Jr.
*Attorney, Agent, or Firm*—Wenderoth, Lind & Ponack

[57] ABSTRACT

By using a polarization controller, a semiconductor laser apparatus oscillating in the transverse magnetic mode in mode-locked state is realized, and a short optical pulse is generated. By coupling this mode-locked semiconductor laser to a wavelength conversion element, a second harmonic wave is generated, and an even shorter optical pulse is obtained at a higher power.

9 Claims, 13 Drawing Sheets

FIG. 6

| | Alignments (lenses are not shown) | Near field pattern and polarization direction allowed to propagate in LiNbO₃ waveguide | Near field patterns and polarization directions of lasers | | evaluation |
|---|---|---|---|---|---|
| | LiNbO₃ waveguide / laser diode | | at LiNbO₃ waveguide facet | at laser facet | |
| (a) | | ↕ | ↕ | ↕ | no good |
| (b) | λ/2 plate | ↔ | ↔ | ↕ | good |
| (c) | | ↔ | ↔ | ↔ | no good |
| (d) | +a | ↔ | ↔ | ↔ | better |

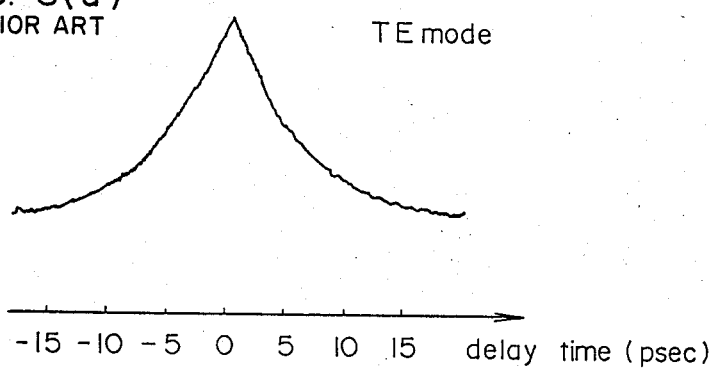
FIG. 8(a) PRIOR ART — TE mode
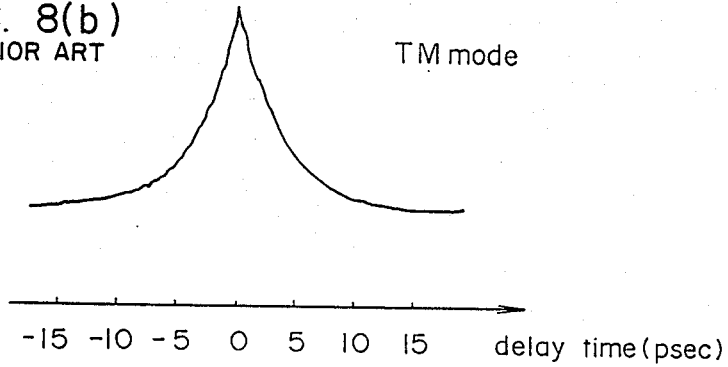
FIG. 8(b) PRIOR ART — TM mode time (psec)

time (psec)

SHORT OPTICAL PULSE GENERATORS USING MODE-LOCKED SEMICONDUCTOR LASERS OSCILLATING IN TRANSVERSE MAGNETIC MODES

BACKGROUND OF THE INVENTION

This invention relates to an apparatus for generating ultrashort optical pulses by using the mode-locking technique of semiconductor lasers applied to optical computing, optical information processing, optical measurement, and optical communication.

The mode-locking by transverse magnetic (TM) mode oscillation of a semiconductor laser has been found more effective for ultrashort optical pulse generation than the mode-locking by transverse electric (TE) mode oscillation of a semiconductor laser widely employed hitherto.

To generate picosecond optical pulses using a semiconductor laser is an important technique for applications in optical computing, optical information processing, optical measurement and optical communication. As a known fact among those skilled in the art, a mode-locking technique using a semiconductor laser with an external cavity configuration is known as one of the methods for generating ultrashort pulses. This technique may be roughly classified into active mode-locking techniques and passive mode-locking techniques. They are described in detail for example, by J. P. van der Ziel in "Mode Locking of Semiconductor Lasers," Semiconductor and Semimetals, vol. 22, Part B, Chapter 1, page 1, 1985. The active mode-locking technique modulates the injection current fed into the semiconductor laser at the round trip frequency of external absorber is contained inside the cavity, and the injection current is kept constant. In both cases, optical pulses are generated at the round trip frequency C/2L of the external cavity (where C is the velocity of the light, and L is the length of external cavity), that is, the time interval of 2L/C, and the pulse width of the optical pulse is from several picoseconds to several tens of picoseconds. Estimating from the envelope width of the oscillation spectrum, an optical pulse width which is nearly Fourier-transform-limited is obtained.

Besides, as mentioned above, for mode-locking using a semiconductor laser, the semiconductor laser has an external cavity configuration. Moreover, the external cavity side of the facet of the semiconductor laser is anti-reflection coated.

A basic composition of the prior art is shown in FIG. 1. An anti-reflection coating 18 is applied on a first end facet 14 of a semiconductor laser 16 composed of an active layer 10 responsible for stimulated emission under current injection, and first and second end facets 14 and 12 of cleaved facets of crystal. A laser light 20 emitted from this semiconductor laser 16 is reflected by an external reflector 22 disposed outside, and the reflected laser light 20 is fed back to the semiconductor laser 16. Since the anti-reflection coating 18 is applied on the first end facet 14, the cavity of this laser is composed of the second end facet 12 at the opposite side of the external cavity, and an external reflector 22. By setting the bias of the injection current into the semiconductor laser 16 below the threshold current, when current modulation is applied at the round trip frequency of the external cavity, the laser light 24 emitted from the second end facet 12 of the semiconductor laser 16 oscillates as an optical pulse train 26. This is a general active mode-locking arrangement.

In a conventional solitary semiconductor laser, the polarization of its output power oscillation in the TE mode in which the direction of electric field is parallel to the P-N junction of the active layer. By nature, the semiconductor laser can oscillate in the TM mode in which the direction of electric field of the output power is perpendicular to the P-N junction of the active layer, but always oscillates in the TE mode. This phenomenon is described in detail, for example, by T. Ikegami in "Reflectivity of Mode at Facet and Oscillation mode in Double-Heterostructure Injection Lasers," IEEE Journal of Quantum Electronics, vol-QE-8, No. 6, p. 470, 1982. Excerpts of the drawings in this publication are shown in FIG. 2. FIG. 2 shows that the two different orthogonally polarized light of the TE mode (solid line) and the TM mode (broken line) are completely different in the reflectivity at the semiconductor laser end facet; the abscisea axes denotes the thickness of the active layer of semiconductor, and the ordinate axis represents the intensity reflectivity of the laser end facet. The transverse mode is the 0th order fundamental mode oscillation, and the refractive index of the active layer is 3.6 and $\Delta n$ shows the ratio of the refractive index of the cladding layer and active layer. As clear from FIG. 2, the reflectivity of the end facet is considerably higher in the TE mode as compared with the TM mode, although depending on the layer thickness and refractive index of the layer composing the laser. In other words, in the semiconductor laser in which the end facets are formed by cleavage, since the cavity reflectivity is greater in the TE mode than in the TM mode, only a small threshold gain is necessary for inducing stimulated emission, and the semiconductor laser oscillates in the TE mode. The same holds true not only in the solitary semiconductor laser but also in the mode-locked semiconductor laser, and the mode-locked semiconductor laser reported hitherto oscillates in the TE mode 28 as shown in FIG. 1.

On the other hand, controlling the polarization of the semiconductor laser emission light by inserting a polarization controller in the cavity of semiconductor laser has been recently studied. It is described in detail for example, by T. Fujita et al. in "Polarization switching in a single frequency external cavity semiconductor laser," Electronics Letters, vol. 23, p. 803, 1987, and by T. Fujita et al. in "Polarization bistability in external cavity semiconductor lasers," Applied Physics Letters, vol. 51, p. 392, 1987. In these publications, it has been shown that the semiconductor laser emission light oscillates in the TM mode. That is, as shown in FIG. 3, when, for example, a Glan-Thompson prism is inserted as a polarization controller 30 between the first end facet 14 and the external reflector 22, the laser light 32 inside the cavity oscillates in the TM mode 34. At this time, the polarization controller 30 is aligned to transmit only the TM mode of laser light. Therefore, the output of laser light 36 also oscillates in the TM mode.

In order to generate ultrashort optical pulses by mode-locking, it is necessary that the external cavity modes of the optical spectrum of the semiconductor laser be arranged at precisely equal frequency spacings, and that these many modes oscillate with the same phases. Accordingly, the reflectivity should be ideally zero at the emission end facet of the external cavity of the semiconductor laser composing the external cavity, that is, at the first end facet. In other words, as shown in the prior art in FIG. 1, an antireflection coating 18 is applied on the first end facet. Actually, however, the reflectivity at this end facet is not completely zero when the semiconductor laser oscillates in the TE mode, and it is reported that a certain residual reflectivity presents. If the residual reflectivity is present on the intermediate facet, the mode spacings of the external cavity modes of the optical spectrum of the oscillating laser light are not equal. The dependence of the external cavity mode spacings on the reflectivity of the intermediate facet has been closely discussed, for example, by H. Sato et al. in "Intensity fluctuation in semiconductor lasers coupled to external cavity," IEEE Journal of Quantum Electronics, vol. QE-21, p. 46, 1985. This phenomenon is described below while referring to FIGS. 4(a)–4(b). The optical spectrum of the conventional mode-locked semiconductor laser oscillating in the TE mode, as shown in FIG. 1, is shown in FIG. 4 (a), in which the relationship is $\nu_{m+n+1} - \nu_{m+n} \neq \nu_{m+n} - \nu_{m+n-1}$, where $\nu_m$ denotes the oscillation frequency of each external cavity mode, and m and n are integers. To realize an ultrashort pulse generation, the relationship $\nu_{p+n+1} - \nu_{p+n} \cong \nu_{p+n} - \nu_{p+n-1}$ as shown in FIG. 4 (b) is required. Only in this case, all the external cavity modes oscillate with the same phases and the laser generates the ultrashort optical pulses.

However, this ideal case has not been demonstrated yet. This is because, as mentioned earlier, the effect of the residual reflectivity at the intermediate facet of the external cavity semiconductor laser is great.

Therefore, as shown in FIG. 4 (b), when each external cavity mode of the mode-locked semiconductor laser oscillates at equal frequency spacings, it is possible for the first time to obtain the ultrashort optical pulses.

So far, in the short wavelength region, shorter than 0.6 μm, as long as III-V compound semiconductor materials are used, laser oscillation is impossible due to the limit of the band-gap energy, and therefore there were no lasers oscillating with such a short wavelength, and large gas-lasers were used. Accordingly, the apparatus using the laser was very large in size, and the industrial field of application was limited. If a compact, short wavelength light source, for example, a light source in the blue wavelength region is realized, it will give an immensely large impact in the field of information processing such as optical disc and laser printer, and also in all optical measurements.

Recently studies have been hence concentrated on the conversion element for converting the semiconductor laser to a half wavelength by making use of the second harmonic wave generation, as reported, for example, by T. Taniuchi and K. Yamamoto in "Miniaturized light source of coherent blue radiation," Technical Digest of CLEO '87, WP6, 1987. FIG. 5 shows a configuration for converting the wavelength of the semiconductor laser light by an optical wavelength conversion element using a conventional LiNbO$_3$ optical waveguide. A fundamental wave 50 oscillating in the TE mode emitted from a semiconductor laser 16 is collimated by a lens 52, and is converted into the TM mode by a half wave plate 54, focused by a lens 56, and enters an optical waveguide 60 fabricated on an LiNbO$_3$ substrate 58. The fundamental wave propagating through the optical waveguide 60 is converted to the second harmonic wave 62 by Chelenkov radiation, when both phase velocities of the fundamental wave and the second harmonic wave are equal. At the present, a second harmonic wave of a wavelength of 0.42 μm at about 1 mW is obtained at the optical output with 120 mW of semiconductor laser light input at a wavelength of 0.84 μm.

In this prior art, the half wave plate 54 is used, which is used for converting the TE mode oscillation of the semiconductor laser emission light to the TM mode. The reason for converting to the TM mode is that only the TM mode of the semiconductor laser propagates effectively in the optical waveguide 60 fabricated on the LiNbO$_3$.

It may lead to an idea of rotating the semiconductor laser by 90° to regard the TE mode oscillation apparently as the TM mode oscillation, but such method is not recommended, which is explained in FIG. 6.

FIG. 6 shows the alignment of semiconductor laser and LiNbO$_3$ optical waveguide, and the polarization direction of the electric field of laser light (shown as an arrow) and near field patterns (shown as ellipses) of the semiconductor laser at the laser facet, at the LiNbO$_3$ facet when focused, and the near field pattern allowed to propagate in the LiNbO$_3$ waveguide.

In line (a) of FIG. 6, the semiconductor laser and optical waveguide are simply aligned, so that the near field patterns are matched, but the semiconductor laser light does not propagate through the optical waveguide because the polarization direction is orthogonal and mismatched.

In line (b) of FIG. 6, by using a half wave plate as in the prior art in FIG. 5, the semiconductor laser light propagates through the optical waveguide, and an SHG light is obtained.

In line (c) of FIG. 6, the semiconductor laser is rotated by 90°; at this time the polarization direction is matched, but the near field pattern is not matched, and favorable coupling is not obtained.

Therefore, as shown in line (d) of FIG. 6, by technically applying $+\alpha$ to the semiconductor laser, when the near field pattern and polarization direction are originally in the TM mode, the coupling efficiency increases, and the apparatus may be simplified.

In addition, the generation of ultrashort pulses has been reported by Taniuchi and Yamamoto in "Picosecond generation by blue laser light source using SHG," Collected Papers from the 49th Academic Seminar of Applied Physics Society 7a-ZD-8. In the configuration shown in FIG. 5, by the gain switching method of directly modulating the semiconductor laser by a comb signal generator, a second harmonic wave of an optical pulse width of about 10 psec is obtained.

The second harmonic wave subjected to Chelenkov radiation as mentioned in the prior art is collimated in the thickness direction of the waveguide, and is dispersed to a spreading angle of about 14° in the transverse direction. Therefore, when a pin hole or the like is used in order to focus on a spot, most output is used in vain, and a higher output is needed for practical use. Therefore, what is important is to notably enhance the wavelength conversion efficiency of short pulse light and to further decrease the width of the short pulse light.

SUMMARY OF THE INVENTION

It is hence a first object of this invention to generate an optical pulse short in time by the mode-locking of a semiconductor laser by an unconventional TM mode oscillation.

It is a second object of this invention to generate an optical pulse short in time, at a higher output power than ever, by coupling a mode-locked semiconductor laser of the TM mode oscillation type noted above to an optical waveguide -type wavelength conversion element. It is also possible to contain the optical waveguide itself in part of the mode-locked semiconductor laser.

To achieve the above objects, the ultrashort optical pulse generating semiconductor laser of this invention comprises a semiconductor laser having an antireflection coating applied on a first facet, an optical system for collimating the laser light emitted from the first facet, an external reflector for feeding back the laser light to the first facet of the semiconductor laser, and a power supply for injecting current to the semiconductor laser, in which the cavity of the laser is composed of the second facet of the semiconductor laser and the external reflector, and a polarization controller for controlling the polarization and inserted between the optical system and the external reflector so as to transmit only the TM mode of the laser light, wherein the laser light emitted from the first and second facets of the semiconductor laser oscillate in the TM mode in a mode-locked state.

The objects of the invention are also achieved by an ultrashort optical pulse generating semiconductor laser which comprises a semiconductor laser having an antireflection coating applied to a first facet, an optical fiber for coupling and guiding the laser light emitted from the first facet, an external reflector for feeding back the laser light to the first facet of the semiconductor laser, and a power supply for injecting current into the semiconductor laser, in which a polarization controller for controlling the polarization is inserted between the optical fiber and the external reflector so as to transmit only the TM mode of the laser light, and the laser light emitted from the first and second facets of the semiconductor laser oscillate in the TM mode in a mode-locked state.

An etalon, used as a wavelength controller may be installed between the polarization controller and the external reflector, and a diffraction grating have a wavelength selective function may be used as the external reflector.

Or, by using the ultrashort optical pulse generating semiconductor laser, the laser light emitted from the second facet of the semiconductor laser is optically coupled to a wavelength conversion element having an optical waveguide structure, and the ultrashort pulse light oscillating in the TM mode in a mode-locked state emitted from the second facet of the semiconductor laser is used as the fundamental wave to be coupled to the wavelength conversion element, and a second harmonic wave of the fundamental wave is generated as output light from the wavelength conversion element.

Moreover, this invention also presents an ultrashort optical pulse generator of a wavelength conversion type comprising an optically coupled structure of a wavelength conversion element having an optical waveguide structure with a semiconductor laser, and a power supply for injecting current into the semiconductor laser, in which the semiconductor laser possesses an anti-reflection coating on a first facet coupled to the wavelength conversion element, and also possesses a high reflective coating on a second facet which is remote from the wavelength conversion element, and the wavelength conversion element has an anti-reflection coating against the fundamental wave on the first facet coupled to the semiconductor laser, and also has a high reflective coating functioning as an external reflector for feeding back the laser light coupled as the fundamental wave to the second facet, wherein the guiding mode of the fundamental wave propagating the wavelength conversion element is a TM mode, and the semiconductor laser oscillates in the TM mode in a mode-locked state.

At this time, the semiconductor laser and wavelength conversion element may be optically coupled to each other by means of a collimating lens and focusing lens, or the semiconductor laser and wavelength conversion element may be joined by buttcoupling.

Incidentally, as the semiconductor laser, a distributed feedback semiconductor laser may be used, and a saturable absorber region may be provided inside the semiconductor laser. Meanwhile, the current injected into the semiconductor laser from the power supply may be modulated at a round trip frequency C/2L (C: velocity of light) with respect to the optical distance L from the first facet of the semiconductor laser to the external reflector.

BRIEF DESCRIPTION OF THE DRAWINGS

FIG. 6 is a diagram showing the alignment of semiconductor laser and LiNbO$_3$ waveguide as wavelength conversion element, near field patterns and polarization direction of semiconductor laser, and near field patterns and polarization direction of light allowed to guide in the wavelength conversion element;

FIGS. 8(a)–8(b) are diagrams showing the results of measurements of short optical pulses in a TE mode and in a TM mode as measured by auto-correlator;

DETAILED DESCRIPTION OF THE INVENTION

Figure 7:
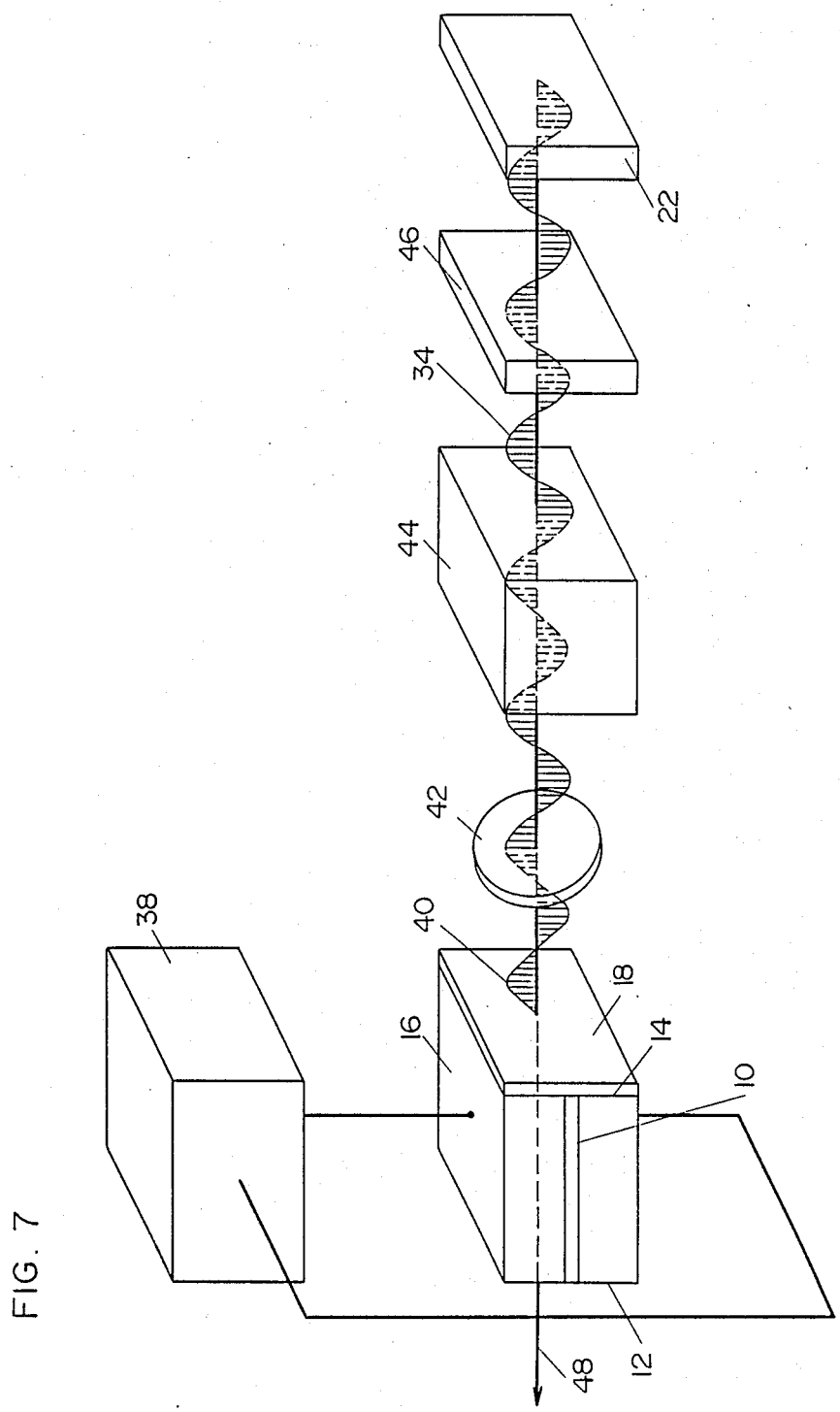
FIG. 7 is a schematic structural drawing of an ultrashort optical pulse generating semiconductor laser in accordance with an embodiment of this invention.

Referring now to the drawings, some of the embodiments of the present invention are described below. First, FIG. 7 shows an embodiment of the present invention. The reference number of the same elements are the same as those of the corresponding elements in the prior art and are explained accordingly.

Figure 1:
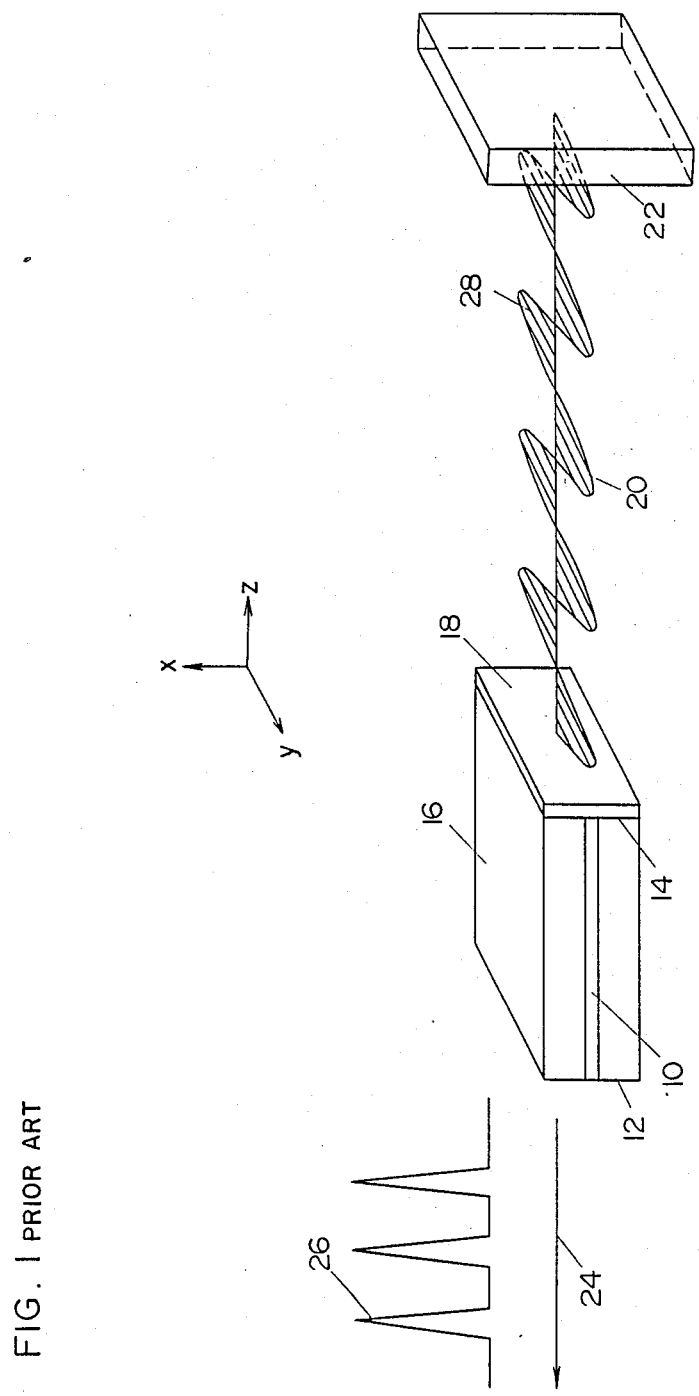
FIG. 1 is a schematic structural drawing of a mode-locked semiconductor laser oscillating in the TE mode in the prior art.
Figure 2:
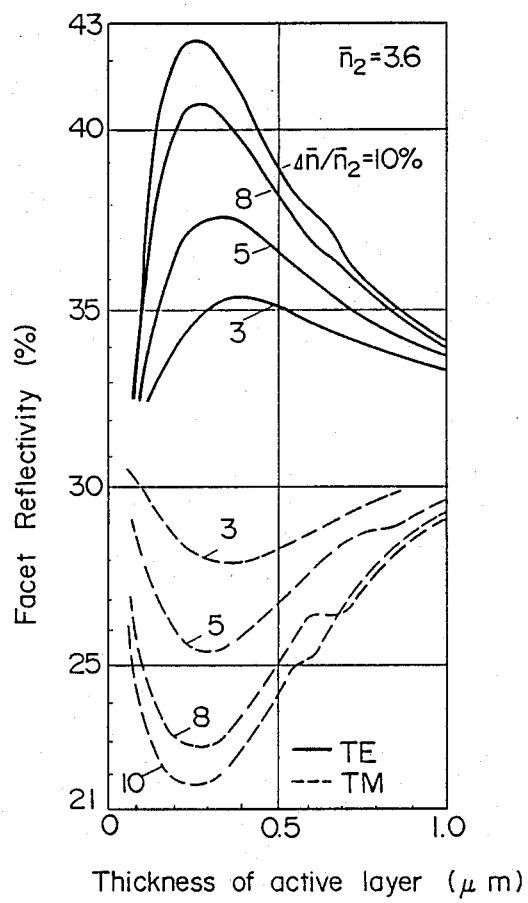
FIG. 2 is a diagram showing the polarization dependence of the reflectivity of a semiconductor laser facet.
Figure 3:
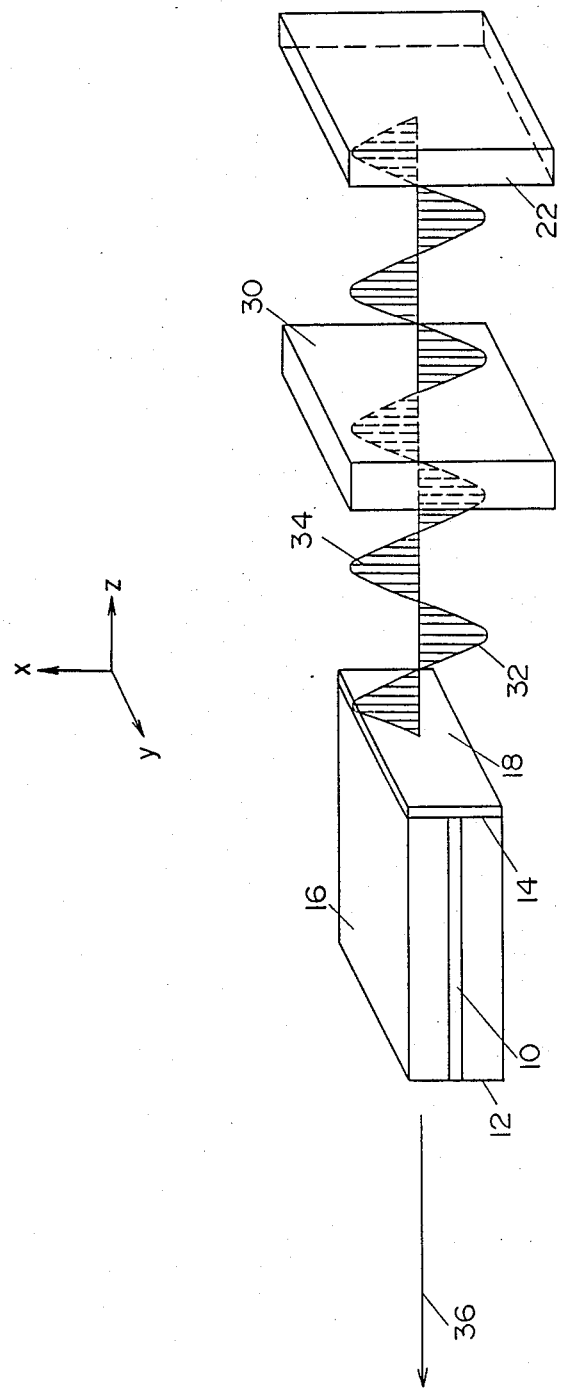
FIG. 3 is a structural drawing for oscillating the semiconductor laser in TM mode.
Figure 4A:
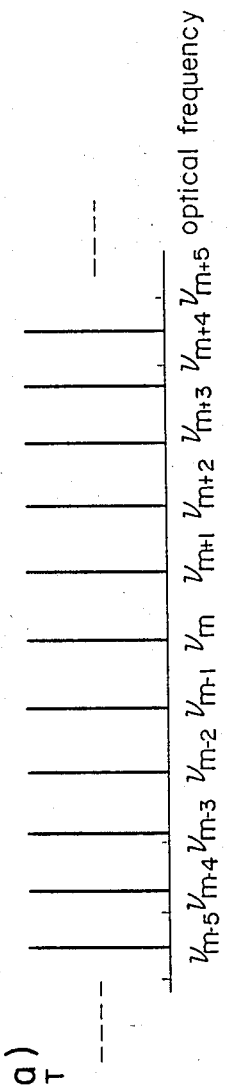
FIG. 4(a)–4(b) are diagrams showing the difference between TE mode and TM mode regarding the mode spacings of the external cavity mode of the laser optical spectra.
Figure 4B:
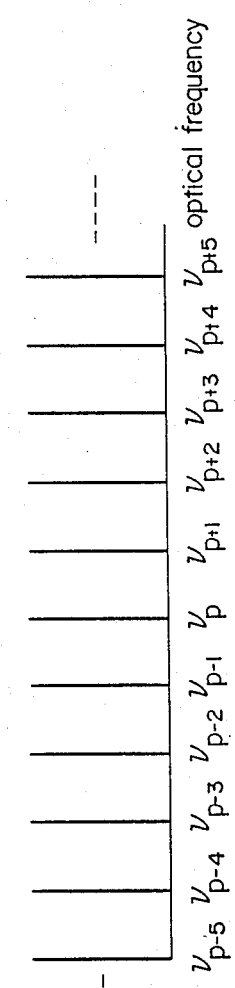

An electric current is injected from a power supply 38 into an active layer 10 of a semiconductor laser 16 composed of first and second cleaved facets 14 and 12. A laser light 40 emitted from the first facet 14 coated with an anti-reflection coating 18 is collimated by a lens 42, and passes through a polarizer 44 used as a polarization controller, and an etalon 46 used as wavelength controller, and is reflected by an external reflector 22, and is optically fed back to the semiconductor laser 16. At this time, when the polarizer 44 is aligned so as to pass only the TM polarized components of the exit light from the semiconductor laser 16, the laser light 40 oscillates in the TM mode 34. When the injection current of this mode-locked semiconductor laser apparatus is biased below the threshold current and the current is modulated at a round-trip frequency of the external resonator, the laser light 48 emitted from the cleaved facet 12 generates an ultrashort pulse. Actually, the time width of this ultrashort pulse can be observed by a streak camera or an auto-correlator using a second harmonic generator, for example, LiIO$_3$. Supposing the external cavity optical length to be 7.5 cm, the round-trip frequency of the external resonator is 2 GHz, and when the injection current from the power supply is modulated at this frequency, an active mode-locking is realized, and the pulse width of the output laser light 48 becomes less than 2 picosecond. That is, in the case of mode-locked oscillation, spectra of light are aligned at equal spacings precisely in each external cavity mode, and the relationship of $\nu_{p+n+1} - \nu_{p+n} \cong \nu_{p+n} - \nu_{p+n-1}$ is obtained. In other words, since the mode-locked semiconductor laser reported hitherto does not possess the polarizer 44 as the polarization controller, it always oscillates in the TE mode, and the effects of the residual reflectivity of the cleaved facet 14 are great, and the spectra of the oscillating light are not equal in the spacing of the external resonance modes as shown in FIG. 4 (a), and the relationship becomes $\nu_{m+n+1} - \nu_{m+n} \neq \nu_{m+n} - \nu_{m+n-1}$, and each external cavity mode can hardly oscillate at the same phase and it is difficult to obtain an ideal mode-locking. By contrast, the mode-locked semiconductor laser of this invention oscillates in the TM mode for the first time by controlling the polarization, so that an ultrashort optical pulse shorter in time than in the prior art can be generated.

FIGS. 8(a)-8(b) show a pulse shape measured by an auto-correlator at the time of mode-locking of semiconductor laser, in which FIGS. 8(a) and 8(b) respectively denote the conventional TE mode mode-locking, and the TM mode mode-locking. As clear from the graph, it is evident that the width of the optical pulse can be shortened in the mode-locking in TM mode.

Figure 9:
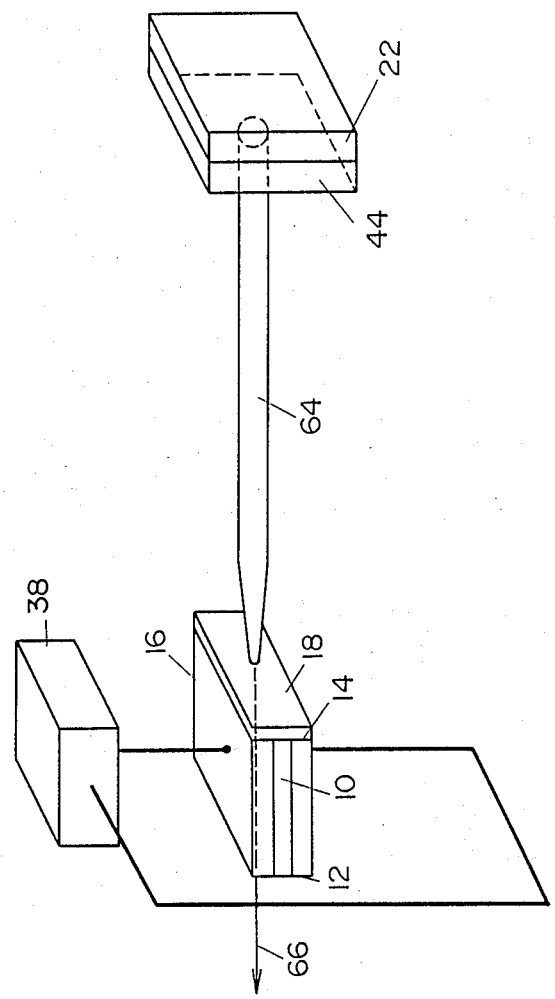
FIG. 9 is a schematic structural drawing of an ultrashort optical pulse generating semiconductor laser in accordance with another embodiment of the present invention.

As a second embodiment, FIG. 9 shows a case of using TM mode-locking semiconductor laser apparatus using optical fiber. It is conceptually the same as the first embodiment, and the lens optical system in the first embodiment is replaced by an optical fiber. That is, the laser light emitted from the first face 14 coated with anti-reflection coating 18 is coupled with an optical fiber 64, and propagates through the optical fiber 64. At a facet of the optical fiber, a polarizer 44 and an external reflector 22 are disposed, and when the polarizer 44 is aligned so as to pass only the TM component of the output light from the semiconductor 16, the laser light 66 oscillates in the TM mode. When an electric current injected from the power supply 38 is biased below the threshold current and the current is modulated at a round-trip frequency of the external resonator, the laser light 66 emitted from the second facet 12 oscillates an ultrashort pulse.

In the first embodiment of the invention, an etalon is used as a wavelength controller, but any other wavelength controller may be similarly used. A diffraction grating possesses the functions of wavelength controller and external reflector. As a semiconductor laser, meanwhile, not only an ordinary Fabry-Perot type semiconductor, but also distributed feedback (DFB) type or distributed Bragg reflector (DBR) structure lasers, and a single longitudinal mode laser in coupled cavity structure such as integrated passive cavity laser may be used. In this case, because of oscillation in the single longitudinal mode, the wavelength controller 46 may not be needed. As the semiconductor laser material, any other materials may be used aside from the AlGaAs compound with an oscillation wavelength in the range of 0.7 to 0.8 $\mu$m or an InP compound with an oscillation wavelength in the range of 1.2 to 1.6 $\mu$m.

This embodiment relates to an active mode-locking for modulating the injection current from the power supply 38, but it may be also applied to passive mode-locking having a saturable absorption region inside the semiconductor laser and driving by injection current of the continuous wave.

Next is explained an embodiment of ultrashort optical pulse generator of the wavelength conversion type. By nature, the wavelength conversion efficiency of a mode-locked semiconductor laser increases $(2N^2+1)/3N$ times the case of a single longitudinal mode semiconductor, where N indicates the number of longitudinal modes being locked. This is described by F. Zernike and J. E. Midwinter in "Applied Nonlinear Optics," A Wiley-Interscience Publication, p. 111.

Incidentally, the pulse width of an output optical pulse of a mode-locking semiconductor laser can be theoretically shortened to about 0.1 psec, and it is suppressed to about 1/10 to 1/100 when generated by the gain switching method.

Therefore, by wavelength conversion of the short pulse output of the semiconductor laser locked in mode by the constitution of the above embodiment of this invention, it is possible to increase the output and shorten the optical pulse of the second harmonic wave.

Figure 10:
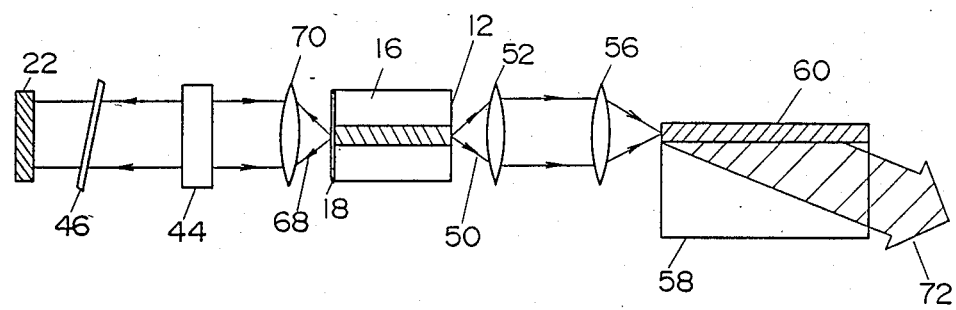
FIG. 10 is a schematic structural drawing of a wavelength conversion type ultrashort optical pulse generator in accordance with a different embodiment of the present invention.

FIG. 10 shows a structural drawing of a wavelength conversion type ultrashort optical pulse generator in accordance with a third embodiment. Element 16 is an AlGaAs semiconductor laser with a wavelength of 0.84 $\mu$m; elements 52, 56, and 70 are lenses; element 46 is an etalon plate, 22 is an external reflector; element 44 is a polarizer; element 58 is a wavelength conversion element, and element 60 is an optical waveguide. An antireflection coating 18 is applied to a first facet of the semiconductor laser 16. The wavelength conversion element 58 has an optical waveguide (2 μm width×0.4 μm thick×6 mm long) formed in a Z-cut LiNbO$_3$ substrate (2×2×6 mm) by a proton exchange process, and the fundamental wave is the lowest order TM mode and the harmonic wave is the TM radiation mode.

The semiconductor laser element 16, lens 70, and external reflectors 22 compose a mode-locked semiconductor laser, and a laser light 68 emitted from the first facet of the semiconductor laser element 16 is collimated by the lens 70, and passes through a polarizer 44 which passes only the TM mode and the etalon plate 46, and is reflected by the external reflector 22, and is fed back again to the semiconductor laser element 16. By biasing the semiconductor laser element 16 below the threshold current and modulating at a modulation frequency $fm=C/2L$ (where C is the velocity of light and L is the optical length between the semiconductor laser facet 18 and the external reflector 22), each mode of mode spacing $\Delta\nu=C/2L$ is locked and oscillates, and a short pulse light 50 of the TM mode is generated.

The short pulse light 50 emitted from the second facet 12 of the semiconductor laser 16 is collimated by the lens 52, and is fed into the optical waveguide 60 through the lens 56.

Part of the fundamental wave entering the optical waveguide 60 is converted in wavelength to the second harmonic wave of a wavelength of 0.42 μm, and is delivered to the substrate side as Chelenkov radiation 72.

Since the intensity of the second harmonic wave is proportional to the square of the intensity of the fundamental wave, the pulse width of the pulse light of the second harmonic wave is shorter than the pulse width of the fundamental wave. In this embodiment, a second harmonic wave of 7 psec was obtained from the fundamental wave of a pulse width of 10 psec.

Figure 11A:
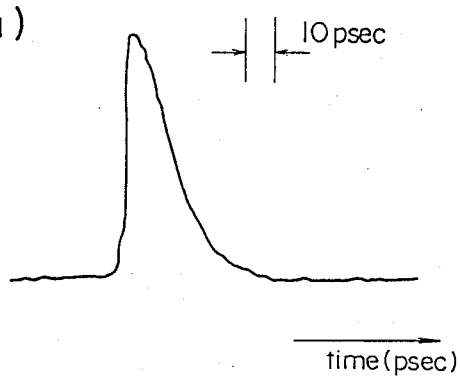
FIGS. 11(a)–11(b) are diagrams showing a short optical pulse shape obtained by a gain switching technique and a short optical pulse shape obtained by mode-locking method of a TM mode, as measured by a streak camera.
Figure 11B:
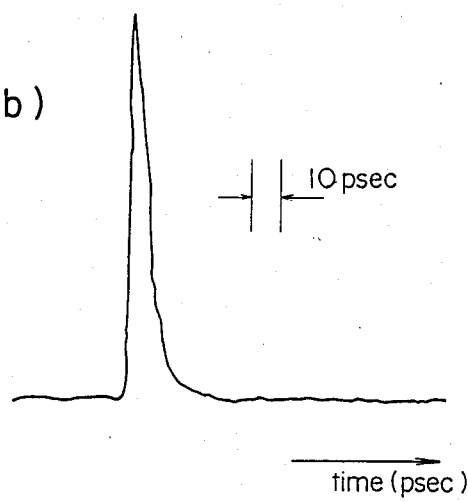

FIGS. 11(a)–11(b) show optical pulse shapes of a second harmonic wave measured by a streak camera, in which diagrams FIGS. 11(a) and (b) respectively show the gain switching of a semiconductor laser and mode-locking in a TM mode as is clear from the diagrams, the pulse width can be shortened in time by TM mode-locking.

Figure 12:
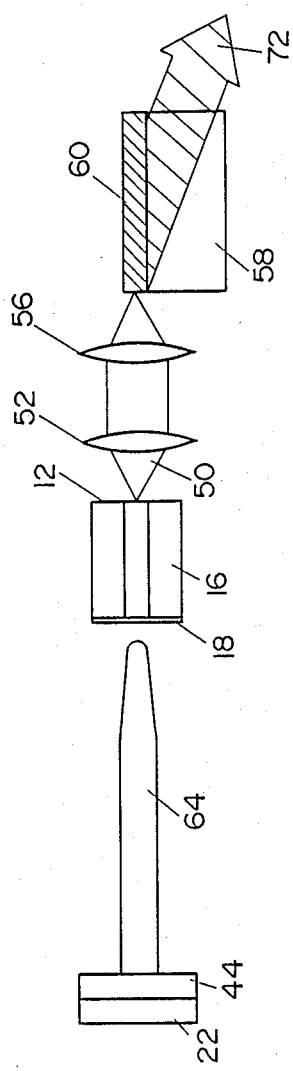
FIG. 12 is a schematic structural drawing of a wavelength conversion type ultrashort optical pulse generator in accordance with another embodiment of the present invention.

FIG. 12 shows a fourth embodiment of the present invention, in which the TM mode-locking semiconductor laser using optical fiber shown in the second embodiment is coupled to a wavelength conversion element. Therefore, the explanation of the mode locked semiconductor laser portion is omitted. When a short pulse light 50 of TM mode emitted from the second facet 12 of the semiconductor laser 16 is coupled to the optical waveguide 60 fabricated on the wavelength conversion element 58 by way of the lenses 52 and 56, a second harmonic wave 72 is delivered to the substrate side as Chelenkov radiation.

Figure 5:
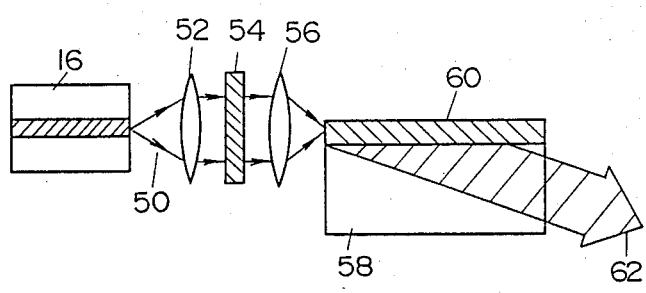
FIG. 5 is a structural drawing of a convention wavelength conversion type ultrashort optical pulse generator.

What should be emphasized in the third and fourth embodiments of the present invention is the following features because of mode-locking in TM mode, as compared with the prior art shown in FIG. 5. It is not necessary to use a half wave plate, and a high coupling of a semiconductor laser and optical waveguide may be easily obtained. As compared with the conventional gain switching method, the pulse width of the second harmonic wave light is shorter, and a higher output is possible.

Figure 13:
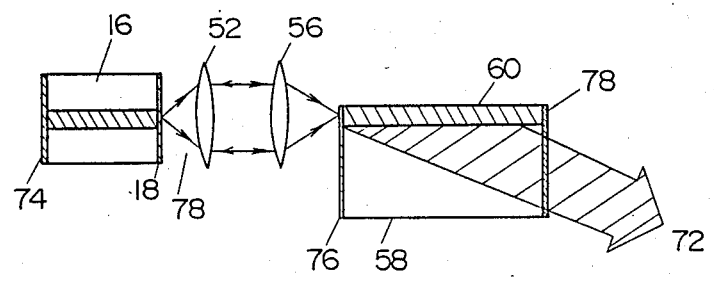
FIG. 13 is a schematic structural drawing of a wavelength conversion type ultrashort optical pulse generator in accordance with a different embodiment of the present invention.

FIG. 13 is a structural drawing of a wavelength conversion type ultrashort optical pulse generator according to a fifth embodiment of the invention.

A first facet of a semiconductor laser 16 is coated with an anti-reflection coating 18 and a second facet, with a high reflective coating 74. At the incident facet of a wavelength conversion element 58, an anti-reflection coating 76 against the wavelength of a fundamental wave is applied, while at the exit facet, a high reflective coating 80 against a against fundamental wave is applied.

The light 78 emitted from the semiconductor laser 16 enters the wavelength conversion element 58 through lenses 52 and 56 to guide the optical waveguide 60, and is reflected by the high reflective coating 80 to be fed back again to the semiconductor laser element 16. In the optical waveguide 60, the TE mode becomes a radiation mode and does not guide, and only the TM mode guides to be fed back to the semiconductor laser 16, and therefore the threshold gain of the TM mode of the semiconductor laser 16 becomes smaller than the TE mode, and the TM mode oscillation is achieved.

In this embodiment, a mode-locked semiconductor laser is composed, using the facet coated with high reflective coating 80 of the wavelength conversion element 58 as the external reflector, and the semiconductor laser is biased below the threshold current so as to be modulated at a modulation frequency $fm=C/2L$ (where L is the optical length between facet 18 and the coating 80 on element 58 so that a short pulse light of a second harmonic wave 72 is obtained in a small and stable construction.

Figure 14:
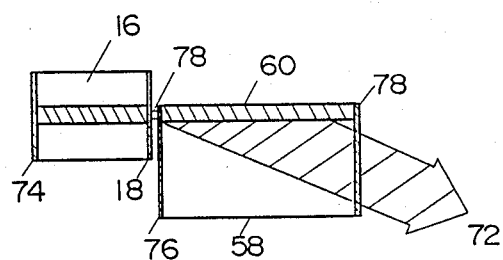
FIG. 14 is a schematic structural drawing of a wavelength conversion type ultrashort optical pulse generator in accordance with a further different embodiment of the present invention.

FIG. 14 shows a structural drawing of a wavelength conversion ultrashort optical pulse generator according to a sixth embodiment of the present invention.

It is same as the fifth embodiment except that the semiconductor laser 16 and wavelength conversion element 58 are butt-coupled accordingly, the apparatus is further reduced in size and it is easier to align the optical axes because a lens system is not employed.

In the third to the six embodiments, meanwhile, LiNbO$_3$ substrates were used as wavelength conversion elements, but any other materials such as LiTaO$_3$, LiIO$_3$, HIO$_3$ and KNbO$_3$ may be equally used. The phase matching was effected between the guide mode and radiation mode, but it may be also effected between two guided modes. Of course, these embodiments may be applied also to passive mode-locking aside from active mode-locking.

Thus, the ultrashort optical pulse generating semiconductor laser apparatus of this invention is an apparatus using the TM mode that is not found in the prior art, and it is possible to generate short optical pulses. Therefore, the performance is enhanced as an optical pulse generator, and it is very effective, for example, as a standard clock optical pulse for optical computing. Besides, since the time width of the optical pulse is small, a high bit rate may be realized, and when combined with an external modulator, it is also suitable as the light source for optical communications. Meanwhile, the ultrashort optical pulse generating semiconductor laser apparatus of this invention is, as compared with the conventional apparatus, precise and equal in the frequency spacing of the external cavity modes as spectra of light, and it may be also used as a frequency standard of light.

Moreover, by converting the wavelength of the short pulse light generated by a mode-locking technique the conversion efficiency may be improved and the pulse width shorter as compared with the conventional wavelength conversion of short pulse light generated by the gain switching method, and the apparatus size may be also reduced by forming a reflector for mode-locking using the exit facet of the wavelength conversion element.

We claim:

1. An ultrashort optical pulse generating mode-locked semiconductor laser apparatus comprising:

a semiconductor laser chip having first and second facets and having an anti-reflection coating applied to said first facet;

a power supply for injecting current into said semiconductor laser chip so as to generate laser light which is emitted from said first facet and said second facet;

an optical system for collimating said laser light emitted from said first facet of said semiconductor laser chip;

an external reflector arranged so as to feed back said emitted laser light from said first facet to said first face of said semiconductor laser chip, wherein a cavity of the laser apparatus is composed of said second facet of said semiconductor laser chip and said external reflector; and a polarization controller aligned between said optical system and said external reflector so as to pass only a TM mode of laser light and to prevent the passage of a TE mode of laser light, whereby said semiconductor laser chip oscillates only in a TM mode; and whereby an output intensity of laser light emitted from said second facet of said semiconductor laser chip is thereby modulated in a mode-locked manner so as to generate short optical pulse trains, at a round-trip frequency of C/2L (C: velocity of light) with respect to an optical length L between said first facet of said semiconductor laser chip and said external reflector.

2. An ultrashort optical pulse generating mode-locked semiconductor laser apparatus comprising:

a semiconductor laser chip having first and second facets and having an anti-reflection coating applied to said first facet;

a power supply for injecting current into said semiconductor laser chip so as to generate laser light which is emitted from both said first facet and said second facet;

a single mode optical fiber for coupling and guiding the laser light emitted from said first facet of the semiconductor laser chip;

an external reflector arranged so as to feed back said emitted laser light from said first facet to said first facet of said semiconductor laser chip, wherein a cavity of the laser apparatus is composed of said second facet of said semiconductor laser chip and said external reflector; and a polarization controller aligned between said single mode optical fiber and said external reflector so as to pass only a TM mode of laser light and so as to prevent the passage of a TE mode of laser light, whereby said semiconductor laser chip oscillates only in a TM mode; and whereby an output intensity of laser light emitted from said second facet of said semiconductor laser chip is thereby modulated in a mode-locked manner so as to generate short optical pulse trains, at a round-trip frequency of C/2L (C: velocity of light) with respect to an optical length L between said first facet of said semiconductor laser chip and said external reflector.

3. An ultrashort optical pulse generating mode-locked semiconductor laser apparatus according to claims 1 or 2, wherein an etalon serving as a wavelength controller is aligned between said polarization controller and said external reflector.

4. An ultrashort optical pulse generating mode-locked semiconductor laser apparatus according to claims 1 or 2, wherein a diffraction grating having a wavelength selective function comprises said external reflector.

5. An ultrashort optical pulse generating mode-locked semiconductor laser apparatus according to claims 1 or 2, further comprising:

a wavelength conversion element comprising: an optical waveguide which is fabricated in a surface portion of a wavelength conversion element; an entrance facet of said optical waveguide, and an exit facet of said optical waveguide;

wherein said optical waveguide is arranged so as to generate a second harmonic wave of a fundamental wave from said exit facet of said optical waveguide, when the fundamental wave is coupled to said entrance facet of said optical waveguide and is guided in said optical waveguide;

and wherein laser light, oscillating in a TM mode in a mode-locked manner, and emitted from said second facet of said semiconductor laser chip is optically coupled to said optical waveguide as the fundamental wave;

whereby an ultrashort pulse output light as the second harmonic wave of the fundamental wave is generated from said exit facet of said optical waveguide at a round-trip frequency of C/2L (C: velocity of light) with respect to said optical length L between said first facet of said semiconductor laser chip and said external reflector.

6. A wavelength conversion type ultrashort optical pulse generating apparatus comprising:

a semiconductor laser chip having an anti-reflection coating applied to a first facet thereof, and also having a high-reflection coating applied to a second facet thereof;

a power supply for injecting current into said semiconductor laser chip so as to generate laser light which is emitted from said first facet and said second facet;

a wavelength conversion element comprising: an optical waveguide which is fabricated in a surface portion of said wavelength conversion element; an entrance facet of said optical waveguide, and an exit facet of said optical waveguide;

wherein said optical waveguide is arranged so as to generate a second harmonic wave of a fundamental wave from said exit facet of said optical waveguide, when the fundamental wave is coupled to said entrance facet of said optical waveguide and is guided in said optical waveguide;

and wherein an anti-reflection coating is applied to said entrance facet of said optical waveguide, and a high-reflective coating is applied to said exit facet of said optical waveguide and wherein both of said coatings are effective against a wavelength of said emitted laser light;

and wherein said laser light emitted from said first facet of said semiconductor laser chip is optically coupled to said entrance facet of said optical waveguide, and guided in said optical waveguide, and reflected back by said exit facet of said optical waveguide for feeding back said laser light to said first facet of said semiconductor laser chip;

and wherein a cavity of said laser comprises said second facet of said semiconductor laser chip and said exit facet of said optical waveguide serving as an external reflector, whereby said laser light allowed to propagate in said optical waveguide oscillates in a TM mode;

whereby said laser light emitted from said first facet of said semiconductor laser chip is modulated in a mode-locked manner so as to generate short optical pulse trains, at a round-trip frequency of C/2L (C: velocity of light) with respect to said optical length L between said first facet of said semiconductor laser chip and said exit facet of said optical waveguide serving as said external reflector;

and whereby said laser light guided in said optical waveguide serves as a fundamental wave for said wavelength conversion element;

and whereby an ultrashort pulse output light as the second harmonic wave of the fundamental wave is generated from said exit facet of said optical waveguide at a round-trip frequency of C/2L (C: velocity of light) with respect to said optical length L between said first facet of said semiconductor laser chip and said exit facet of said optical waveguide serving as said external reflector.

7. An ultrashort optical pulse generating apparatus according to claims 1, 2, 5 or 6, wherein a distributed feedback type semiconductor laser comprises said semiconductor laser chip.

8. An ultrashort optical pulse generating apparatus according to claims 1, 2, 5 or 6, wherein a saturable absorption region is provided inside said semiconductor laser chip.

9. An ultrashort optical pulse generating apparatus according to claims 1, 2, 5 or 6, wherein said current injected from said power supply into said semiconductor laser chip is modulated at a round-trip frequency of C/2L (C: velocity of light) with respect to said optical length L between said first facet of said semiconductor laser chip and said external reflector.

* * * * *